United States Patent [19]

Langgard

[11] Patent Number: 5,175,493
[45] Date of Patent: Dec. 29, 1992

[54] SHIELDED ELECTRICAL CONTACT SPRING PROBE ASSEMBLY
[75] Inventor: Ulf R. Langgard, Overland Park, Kans.
[73] Assignee: Interconnect Devices, Inc., Kansas City, Kans.
[21] Appl. No.: 775,714
[22] Filed: Oct. 11, 1991
[51] Int. Cl.$^5$ ............................................. G01R 1/02
[52] U.S. Cl. .............................. 324/158 P; 324/72.5; 324/158 F; 439/482
[58] Field of Search ............... 324/158 P, 158 F, 72.5; 439/482

[56] References Cited

U.S. PATENT DOCUMENTS

| | | |
|---|---|---|
| 3,843,832 | 10/1974 | Petersen et al. . |
| 3,866,119 | 2/1975 | Ardezzone et al. . |
| 3,939,713 | 2/1976 | Estey . |
| 3,992,073 | 11/1976 | Buchoff et al. ...................... 439/482 |
| 4,096,752 | 6/1978 | Tonnelli . |
| 4,138,592 | 2/1979 | Capehart et al. . |
| 4,452,250 | 6/1984 | Chance et al. . |
| 4,526,177 | 7/1985 | Riedy et al. . |
| 4,544,888 | 10/1985 | Koaternik . |
| 4,607,224 | 8/1986 | Codrington . |
| 4,629,975 | 12/1986 | Fiorito et al. . |
| 4,651,310 | 3/1987 | Kaneko et al. . |
| 4,678,865 | 7/1987 | Sherwin . |
| 4,727,319 | 2/1988 | Shahriary . |
| 4,731,577 | 3/1988 | Logan . |
| 4,734,046 | 3/1988 | McAllister et al. .................. 439/482 |
| 4,739,259 | 4/1988 | Hadurn et al. . |
| 4,740,746 | 4/1988 | Pollock et al. ...................... 324/72.5 |
| 4,764,722 | 8/1988 | Coughlin et al. .................... 439/482 |
| 4,783,624 | 11/1988 | Sabin . |
| 4,807,596 | 2/1989 | Hochberger et al. . |
| 4,829,242 | 5/1989 | Carey et al. . |
| 4,894,612 | 1/1990 | Drake et al. . |
| 4,923,407 | 5/1990 | Rice et al. . |
| 5,009,613 | 4/1991 | Langgard et al. . |

FOREIGN PATENT DOCUMENTS

| | | |
|---|---|---|
| 2034416 | 1/1972 | Fed. Rep. of Germany ...... 439/482 |
| 2243457 | 3/1974 | Fed. Rep. of Germany . |
| 2717420 | 10/1978 | Fed. Rep. of Germany . |
| 2915742C | 10/1980 | Fed. Rep. of Germany . |
| 3022394 | 12/1981 | Fed. Rep. of Germany ... 324/158 P |
| 3030101 | 3/1982 | Fed. Rep. of Germany ... 324/158 P |
| 3225907 | 1/1984 | Fed. Rep. of Germany ... 324/158 P |
| 0021066 | 1/1987 | Japan ............................. 324/158 P |
| 0085872 | 4/1987 | Japan ............................. 324/158 P |

OTHER PUBLICATIONS

"Tester Contact Method", by Kappel et al., IBM Tech. Disc. Bull., vol. 21, #9, Feb. 1979, p. 3742.
"Probe for MOS Measurements" by Hoekstra, IBM Tech. Disc. Bull., vol. 13, #10, Mar. 1972, pp. 2981-2982.
"Pad Deformation Contactor", by Byrnes et al., IBM Tech. Disc. Bull., vol. 21, #11, Apr. 1979, pp. 4511-4522.
"A Coaxial Test Probe", by Abbatecola et al., IBM Tech. Disc. Bull., vol. 12, #7, Dec. 1969, p. 1061.

Primary Examiner—Ernest F. Karlsen
Assistant Examiner—William J. Burns
Attorney, Agent, or Firm—Wm. Bruce Day

[57] ABSTRACT

A shielded electrical contact spring probe assembly for testing electrical printed circuit boards includes an outer barrel having an open end and a remote end, an inner core of dielectric material coaxially mounted within the barrel, and an electrical contact spring probe reciprocally seated within an axial bore in the core. A shield surrounds the core between the barrel inner wall and the core and extends the full length of the barrel. A shielding plunger is located in a cylindrical space between the barrel and the shield. The probe assembly remote end is for connection of an electrical transmission line, or in an alternative embodiment, inserting a second electrical contact spring probe within the core. The configuration and material of the core and the shield enable the entire probe assembly to maintain a selected impedance. The electrical contact spring probe seated within the core axial bore includes a separate barrel having a spring seating end and an open end, a compression spring seated in the closed end of the barrel, and a plunger inserted into the barrel. The plunger includes a tail section, connected to a shaft or probe section that protrudes from the barrel and includes the probe tip. The shielding plunger of the assembly is spring loaded to extend outwardly surrounding the probe tip when the probe tip is also in an outwardly extended position. The plunger fits snugly against portions of a circuit board surrounding test site and shields the probe tip against emission of RF energy.

22 Claims, 3 Drawing Sheets

SHIELDED ELECTRICAL CONTACT SPRING PROBE ASSEMBLY

FIELD OF THE INVENTION

The present invention is directed to a spring contact probe assembly for use in apparatus that test printed circuit boards. More particularly, the present invention is directed to an electrical contact probe which is configured to reduce or eliminate RF emission in order to maintain the integrity of high frequency (RF) signals.

Electrical contact spring probe assemblies are commonly used in testing printed circuit boards and other types of circuits that require a number of contact points to be checked for continuity or correct electrical signals. Such probe assemblies are receptacles that are typically fitted into apertures in a testing board. The entire board is moved toward and away from the testing subject by an electromechanical or pneumatic means. Typically, probe assemblies are mounted throughout the surface area of a testing board in rows and columns in high density arrays. A compression spring inside each probe assembly forces the plunger of the probe against the circuit board. If the probe tip is exposed, it may emit RF energy during the testing cycle, which deteriorates the signal integrity.

When a probe tip emits RF energy, the quality of the signal transmission is impaired. It is critical to the quality of the signal transmission that the transmission occur along a path of constant impedance. Further, high signal frequencies will tend to be emitted, just like radio signals, from a length of unshielded wire or an unshielded probe. The length of the unshielded wire or probe that a signal can be transmitted through without the signal being emitted into space is a function of frequency. The higher the frequency, the more critical the requirement to have a short length of the unshielded wire or probe.

Signal frequencies above 50 kilohertz typically require a constant impedance environment. This is why coaxial cables and coaxial connectors are used in transmitting these frequencies. Further, whether a probe is unshielded or exposed to the environment, or has a different impedance than the transmission cable will have similar distortion effects on the signal quality.

An effort to overcome a related problem is found in McAllister et al. U.S. Pat. No. 4,734,046 assigned to International Business Machines Corporation on Mar. 14, 1986 for a Coaxial Converter with Resilient Terminal. McAllister et al. '046 discloses an electrical coaxial connector having a central spring-loaded pin electrode encircled by a circumferential shoulder electrode in which spring-loaded contact pins may be mounted. The problem in testing semiconductor microcircuits is that the size and spacing of the chips with electrodes in microcircuits is extremely small. Devices have been developed which interface between the circuits and the coaxial connectors; however, a problem is the physical size of the device necessary to accommodate the coaxial connectors.

McAllister et al. '046 attempts to overcome the spacing and size problem by having a spring-loaded pin-shaped central contact connect with the inner connector of a coaxial cable, and the circumference element connect with the conductor of the coaxial cable. Then a circumferential element serves as a housing for one or more outer contacts which are spring loaded and pin-shaped. The spring loading provides for electrical contact. The arrangement permits connection to be made and results in reduced spacing requirements.

McAllister et al. '046, however, allows and requires a spacing between the central probe and one pin-shaped contact to be equal in spacing between a corresponding set of terminal contacts. Further, the probe contacts are exposed to the environment when the probe tips are in contact with the testing boards The exposure is due to not shielding the probes as they make contact with the testing boards The spacing requirement and the exposure to the environment make the McAllister et al. '046 unsuitable for high frequency transmission signals, because the exposed areas of the probes will lead to emissions from the unshielded areas. This in turn leads to distortion of the frequency signal. Accordingly, there is a need for a shielded electrical contact spring probe assembly that can provide for testing of printed circuit boards that provides signal transmission along a path of constant impedance while simultaneously shielding the probe contacts against emission of RF energy.

OBJECTS OF THE INVENTION

Accordingly, it is a primary object of the present invention to provide a shielded electrical contact spring probe assembly that can reliably and repeatedly provide for testing of printed circuit boards along a signal transmission path of constant impedance.

It is a further object of the present invention to provide a shielded electrical contact spring probe assembly that has a shielding plunger that shields electrical contact spring probe contacts against emission of RF energy when testing printed circuit boards.

It is a further object of the present invention to provide a spring contact electrical probe that has a plunger that will continue to operate and reciprocate within the barrel reliably despite prolonged use, and that can easily be removed and replaced from the assembly.

It is a further object of the present invention to provide a shielded electrical contact spring probe assembly that has a shielding plunger that will continue to operate and reciprocate within the assembly despite prolonged use.

These and other objects of the present invention are achieved by providing a barrel having an open end and a remote end, a crimp about the circumference of the barrel located between the open end and the remote end, a core of dielectric material coaxially mounted within the barrel, an electrical contact spring probe reciprocally mounted within the core, a shield surrounding a core and extending the full length thereof, and a shielding plunger located in the space formed by the barrel and the shield. The remote end provides for connection of an electrical transmission line to the remote end, or seating a second electrical contact spring probe within the core.

The electrical contact spring probe comprises a barrel having a spring seating end and crimps, such as four in number, between the spring seating end and the open end of the barrel, and a plunger seated within the barrel and retained therein by the crimps. The plunger includes a shaft and a tail section A portion of the plunger extends beyond the open end of the barrel at all times. The compression spring urges the plunger outwardly of the barrel into engagement with the test circuit board.

The plunger includes a probe tip end and a contact stem end. The contact stem end has a larger cross section than the cross section of the barrel The compression spring is pressed onto the contact stem of the barrel, so that the plunger will not become disengaged from the barrel The plunger further includes a tail section and a shank section In the preferred embodiment the plunger is made from a single piece of metal.

The plunger includes a pin-shaped probe tip. In the preferred embodiment, the barrel is cylindrical, the compression spring is cylindrical, and the plunger is substantially cylindrical.

The shielding plunger shields the pin-shaped probe tip when the probe is outwardly extended. The shielding plunger comprises a substantially cylindrical barrel having a spring seating end, an open end, a crimp about the circumference of the barrel at a location between the open end and the spring seating end, and a compression spring seated in the spring seating end. The spring seating end includes a tail section located below the crimp and has a cross section larger than the cross section of the assembly barrel. The tail section has a contact stem that has the compression spring pressed onto the contact stem. The compression spring urges the shielding plunger outwardly of the assembly into engagement with the test circuit board. The crimp about the circumference of the assembly barrel retains the shielding plunger in the formed space.

Other objects and advantages of this invention will become apparent from the following description taken in connection with the accompanying drawings, wherein is set forth by way of illustration and example, an embodiment of this invention

DESCRIPTION OF THE PREFERRED EMBODIMENT

As required, a detailed embodiment of the present invention is disclosed herein It is, however, to be understood that the disclosed embodiment is merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
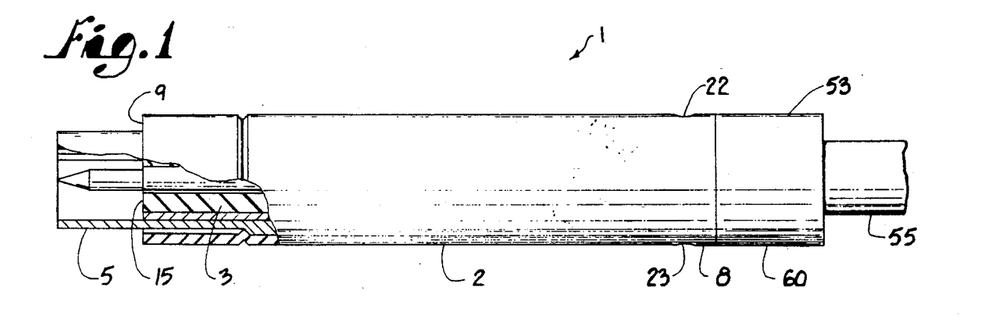
FIG. 1 is a side elevational view of the shielded electrical contact spring probe assembly connected to a coaxial transmission line according to the present invention.

The reference numeral 1, FIG. 1, generally indicates a shielded electrical contact probe assembly, having an outer circumferential barrel 2 including an inner core 3 of dielectric or insulating material coaxially mounted within the barrel 2. An extensible spring probe 4 is coaxially mounted within the barrel core 3 and protrudes outwardly. To shield the spring probe 4 from unwanted emission of RF energy, a retractable shield 5 extends and retracts from an end of the barrel 2.

Figure 2:
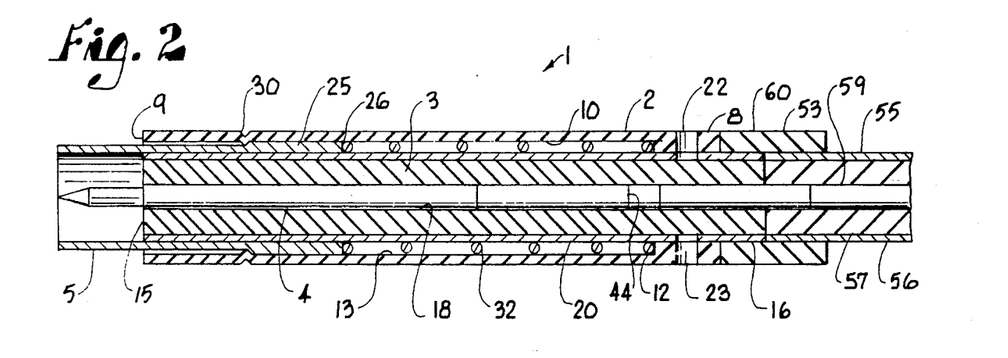
FIG. 2 is a longitudinal sectional view of the probe assembly of FIG. 1.

In greater detail, the barrel 2 has a connector end 8 having means for connection to wiring as described below and an open end 9 through which the spring probe 4 and shield 5 extend. The barrel 2 is elongate, generally cylindrical and hollow, having an interior passage 10 receiving the core 3. Preferably, the barrel 2 is formed of beryllium copper alloy and may be gold plated for optimal electrical conductivity. Interior shoulders 12 adjacent the connector end 8 close a cylindrical ring slot 13 extending toward the open end 9 and opening thereinto.

The core 3 is positioned within the barrel interior passage 10 and has an open end 15 coincident with the barrel open end 9. At the connector end 8 of the barrel 2, the core 3 extends outwardly to provide a core connector end 16.

The core 3 is of a dielectric material such as a solid or a foamed Teflon, with foamed Teflon being preferred. Foamed Teflon is made with air or an inert gas such that when injected to form the core 3, the foamed Teflon has tiny gas bubbles therein to increase the insulating impedance ability of the core.

The core 3 has an axial bore 18 extending therethrough the length of the core and is surrounded by a cylindrical shell 20 preferably of non-magnetic stainless steel.

The core 3 and shell 20 together combine to provide the spring probe 4 with a selected impedance, such as measured in ohms. The selected impedance is determined by (a) selected dielectric materials, and (b) selected measurements or radial spacings.

The desired measurements and radial spacings are determined by the use of an equation for determining the characteristic impedance of a coaxial cable, which is as follows:

$$Zo = \frac{138}{\sqrt{K}} \log \frac{b}{a}$$

where K=dielectric constant of the insulating material (obtained from industry standard tables); b=inside diameter of the outer conductor; a=outside diameter of the inner conductor. The characteristic impedance is dependent upon inductance and capacitance per unit length, and is dependent upon the geometry of the cable or device construction and upon the dielectric constant of the insulation which separates the conductors. In the instant invention, Teflon is the preferred insulator and in the poured or solid version has a dielectric constant of 2.1.

Figure 3:
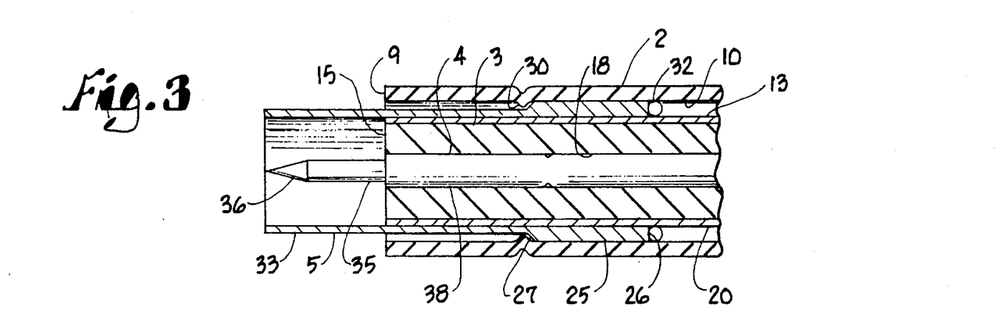
FIG. 3 is a fragmentary longitudinal sectional view of the shielded electrical contact spring probe assembly showing details of a tip area.

In the illustrated example, the core 3 is secured to the barrel 2 at the core connector end 16 by pins 22 and 23 extending through the barrel 2 and through the shell 20 and adjacent interior shoulders 12. In the area surrounding the pins 22 and 23, the shell 20 smoothly meets the interior passage 10 in a close tolerance fit At the open end 15, the core 3 is connected to the barrel 2 by the retractable shield 5. In the illustrated example, the retractable shield 5 has an enlarged tail portion 25 terminating in an end abutment 26 and an opposite shoulder 27, FIG. 3. The enlarged tail portion 25 is of such a thickness that it completely fills the radial distance of the ring slot 13 between the shell 20 and the barrel interior passage 10 and smoothly slides between the two. In a forward position, as shown in FIG. 3, the shoulder 27 impinges against a circumferential crimp 30 adjacent the barrel open end 9 and a retracted position defined by the extent of compression of a coil spring of a biasing means, such as a coil spring 32, extending in the ring slot 13 between the tail portion end abutment 26 and the barrel interior shoulders 12. The shield 5 has an extensible portion 33, a portion of which extends outwardly beyond the barrel open end 9 and which is of a lesser diameter than the enlarged tail portion 25 so that it slides beyond the crimp 30.

Figure 5:
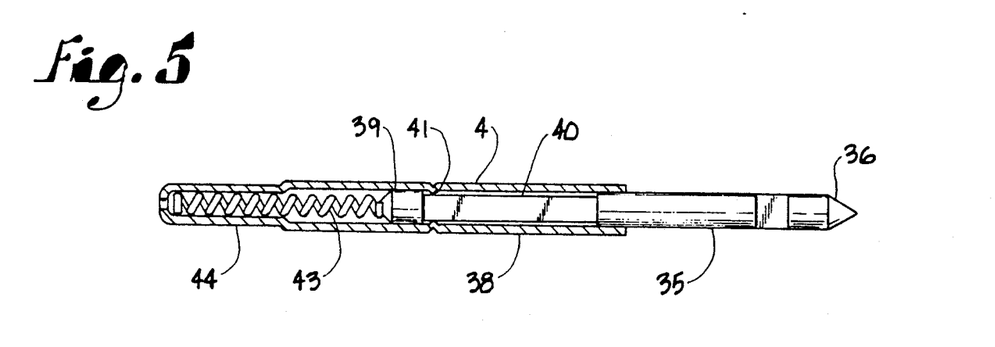
FIG. 5 is a longitudinal sectional view of the electrical contact spring probe of FIG. 4 removed from the assembly and illustrating the probe tip in a full outward extended position.

The spring probe 4 is inserted within the axial bore 18 of the core 3 and in the illustrated example, FIGS. 1, 2 and 3, the probe 4 is substantially the same or similar to that disclosed in Sabin U.S. Pat. No. 4,783,624, contact Probe Device, assigned to Interconnect Devices, Inc. and incorporated herein by reference The contact spring probe 4, FIG. 5, includes a plunger 35 having a probe tip 36 that provides for electrical contact with a circuit board as described below. The plunger 35 is retractable into a probe barrel 38 and includes a head portion 39 and a necked down shaft 40 which slides along a crimp 41 located midway of the length of the barrel 38. A coil spring 43 at a rear end 44 of the barrel 38 urges the head portion 39 outwardly and pushes the plunger 35 outwardly to urge the tip 36 into electrical contact. Preferably, the spring probe 4 is of a very narrow and thin design so that the core 3 adds lateral strength and resistance to bending of the probe 4. The spring probe 4 is inserted into the core bore 18 so that the barrel 38 is entirely concealed within the bore 18 and the plunger 35 extends therefrom. Ideally, the furthest extent of the plunger 35 is the same as the furthest extent of the shield 5, as shown in FIGS. 2 and 3.

Figure 4:
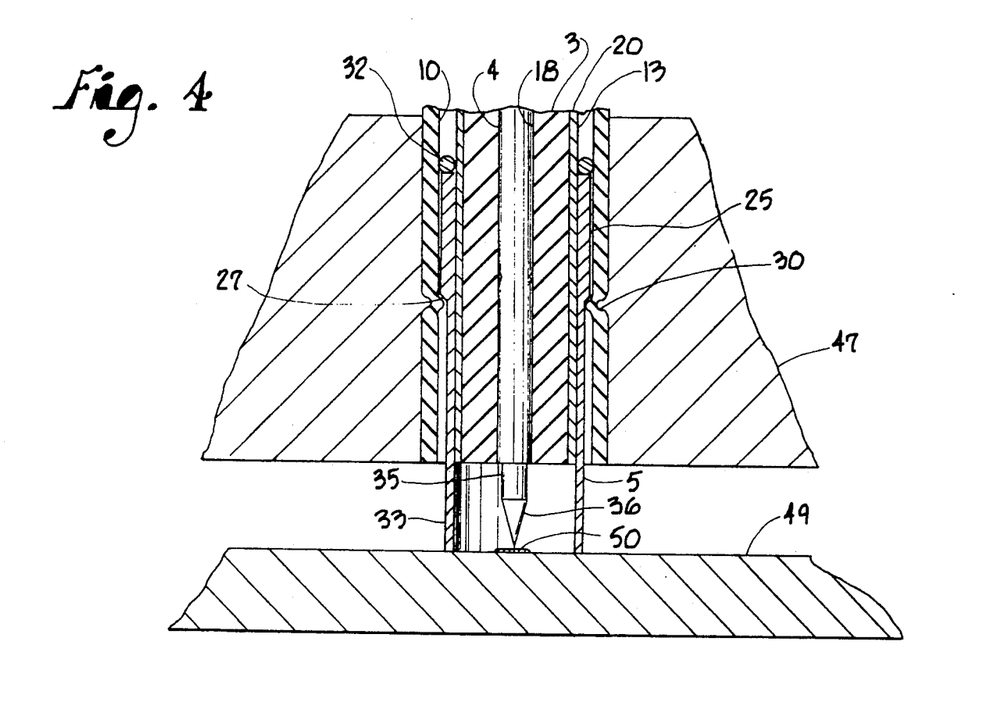
FIG. 4 is a fragmentary longitudinal sectional view of the probe assembly of FIG. 3, illustrating the probe tip end and the shielding plurality in contact with a test circuit board.

The probe assembly 1 is shown in FIG. 4 and placed within a mounting fixture 47 which, in the illustrated example, orients the probe assembly 1 with the plunger tip 36 extending downwardly, although the reverse orientation is generally preferred. In the reverse orientation, the plunger tip 36 projects upwardly and a printed circuit board to be tested is brought down into contact with the tip 36 by various means, normally a vacuum pressure assembly. In the example shown in FIG. 4, a printed circuit board 49 having a test site 50 which may be a circuit runner or connection point is brought into contact with the plunger tip 36. The plunger tip 36 penetrates any contaminants or varnishes left on the test site 50 by the manufacturing process and electrical current flows through a test computer through the spring probe 4, plunger 35 and tip 36 to the test site 50. Alternatively, electrical current can flow from the test site back through the spring probe 4. Normally, as the printed circuit board 49 is brought into contact with the spring probe 4, the plunger 35 retracts slightly and is held against the test site 50 by the interior coil spring 43, thereby assuring good electrical contact. At the same time, with the probe assembly the shield 5 encircling the plunger 35 is also urged outwardly by its associated coil spring 32 and also contacts the printed circuit board 49, as shown in FIG. 4, to snugly abut the board 49 and guard against any leakage of RF energy from the plunger 36 as electrical current is applied thereto. Normally, the printed circuit board 49 is brought into such contact with the shield 5 so that the shield 5 is retracted slightly and the pressure of the coil spring 32 urges it into contact surrounding the plunger 35.

To route current to or away from the probe assembly the connector end 8, FIG. 2, includes a connector, such as the exemplary connector shown therein. An exemplary connector 53 includes a coaxial cable 55 having an outer covering 56, an inner core of dielectric material 57 and a center conductor 59 protruding from an end of the coaxial cable 55. A coupling 60 connects the coaxial cable 55 to the core connector end 16 with the coaxial cable conductor 59 extending into the axial bore 18. The conductor 59 contacts and provides electrical connection with the rear end 44 of the spring probe 4. What is desired is that the shielding covering 56 of the coaxial cable 55 be in electrical contact for making a good ground connection with the core shell through end to end abutment or overlap and soldering techniques as are commonly used in the industry. As shown in FIG. 2, a coupling 60 is used which overlaps the shell 20 and the conductive covering 56 also to provide good electrical contact.

Figure 6:
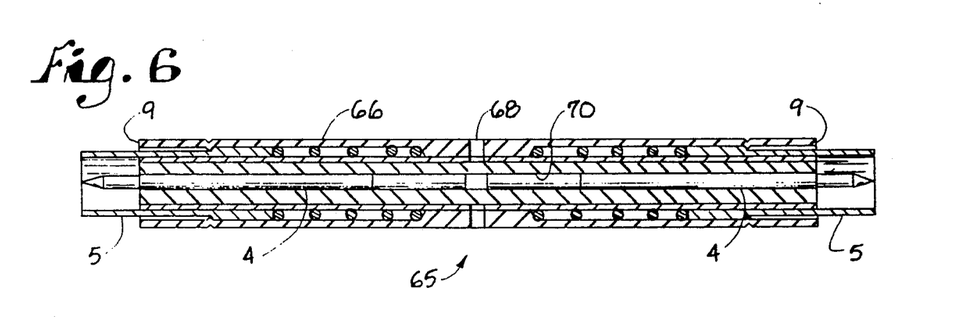
FIG. 6 is a longitudinal sectional view of the shielded electrical contact spring probe assembly with two electrical contact spring probe showing an alternative embodiment of the present invention.
Figure 7:
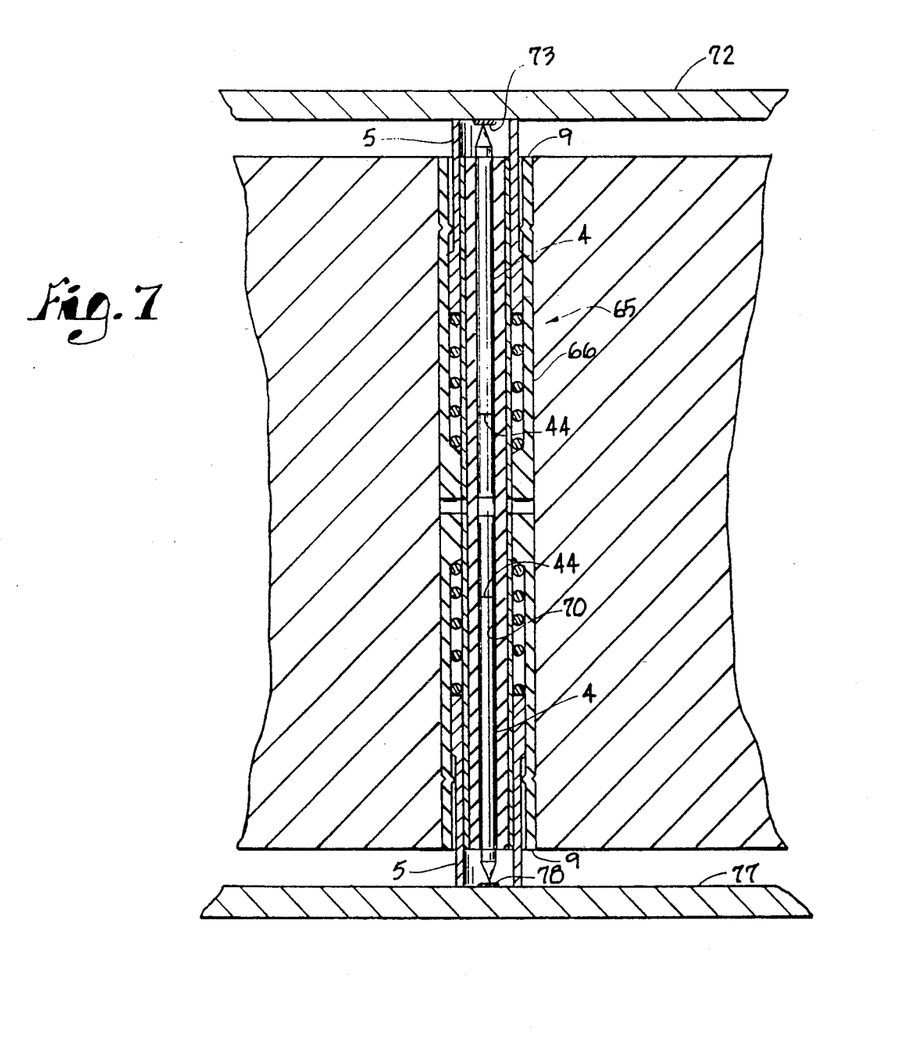
FIG. 7 is a longitudinal sectional view of the probe assembly of FIG. 6 mounted within a wireless test fixture and illustrating the probe tip ends and the shielding plungers in contact with a test circuit board and a fixture board.

An alternative embodiment of the probe assembly 1 is shown in connection with FIGS. 6 and 7 wherein is shown a particular variety especially adapted for use in so called wireless fixturing. In wireless fixturing, a probe is placed in a fixture and then is connected directly from the printed circuit board under test to a test computer board. In the illustrated example, a double ended probe assembly 65 is utilized which is substantially a doubled structure of the type shown in FIG. 2 wherein an elongate barrel 66 is used which has center connector pins 68 joining the structure together. The double ended probe assembly 65 is the same as probe assembly 1, but the axial bore 70 includes two spring probes 4 in back to back relationship. The double ended probe assembly 65 then does not have a connector end 8, but indeed has two open ends through each of which shields 5 extend.

In the relationship shown in FIG. 7, an upper printed circuit board is termed a device under test 72 and has a test site 73. The double ended probe assembly 65 is held within a fixture 75 and a lower circuit board provides the function of being a computer connector board 77 which may have runners connected directly to a computer. The board 77 has a connector site 78 with the opposed probes 4 respectively electrically connecting the test site 73 to the connector site 78.

As shown in FIG. 7, the probes are spaced from each other at their opposing rear ends 44. Electrical conductivity is maintained by conductive epoxy or other suitable substance filling the void.

As will be appreciated, both the single probe assembly and the double ended probe assembly 65 are alternative embodiments of the preferred form. Use of either is determined by the configuration of the test fixtures utilized by the testing facility In particular, the double ended probe assembly 65 permits advantageous wireless testing without a necessity of connecting an electrical wire lead to each individual probe, as usual in the use of the probe assembly 1. The design of the double ended probe assembly 65 allows for two electrical spring contact probes 4 to make contact with the device under test 72 and a test card or computer connector board 77. The probes 4 can be removed and replaced without difficulty for both the single ended probe assembly 1 and the double ended probe assembly 65. Further, the shielding plungers 5, with either the probe assembly 1 or the double ended probe assembly 65, guard against emission of RF energy from the probe tips 36, while the shell 20 and core 3 provide a selective impedance for the probes 4. In this manner, the shell 20 acts as a shield against the emission of RF energy. Both probe assemblies 1 and 65 provide signal transmission along the path of constant impedance while shielding the probes 4 against emission of RF energy in a wireless circuit board testing environment.

It is to be understood that while certain forms of this invention have been illustrated and described, it is not to be limited thereto, except insofar as such limitations are included in the following claims:

I claim:

1. A shielded electrical contact spring probe assembly comprising:
   a) a barrel formed of conductive material and having an open end and a remote end, said remote end providing means for an electrical path through said barrel;
   b) a core of dielectric material coaxially mounted within said barrel and having an open end coincident with said barrel open end, said core having an axial bore therein;
   c) an electrical contact spring probe reciprocally seated within said core bore and having a tip end axially extensible beyond said core open end, said probe having means biasing said probe to an outwardly extended position, said probe tip end having means for electrical contact with a target;
   d) a shield formed of electrically conductive material surrounding said core and extending the full length thereof, and coincidentally terminating with said core at said open end, and said shield having means for an electrical conductive path through said shield and said barrel;
   e) said shield and said barrel being separated to form a space;
   f) a shielding plunger, formed of electrically conductive material, located in said space and having a seating end having a biasing means in said seating end, said plunger having means biasing said plunger to a outwardly extended position terminating coincidentally and surrounding said probe tip when said probe tip is in an outwardly extended position for fitting snugly against a target and shielding said probe tip against emission of RF energy.

2. A shielded electrical contact spring probe assembly comprising:
   a) a barrel formed of conductive material and having an open end and a remote end, said remote end providing means for an electrical path through said barrel;
   b) a core of dielectric material coaxially mounted within said barrel and having an open end coincident with said barrel open end, said core having an axial bore therein;
   c) an electrical contact spring probe reciprocally seated within said core bore and having a tip end axially extensible beyond said core open end, said probe having means biasing said probe to an outwardly extended position, said probe tip end having means for electrical contact with a target, said probe having means for easy removal and replacement of said probe from said core bore;
   d) a shield formed of electrically conductive material surrounding said core and extending the full length thereof, and coincidentally terminating with said core at said open end, and said shield having means for an electrical conductive path through said shield and said barrel;
   e) said shield and said barrel being separated to form a space;
   f) a shielding plunger, formed of electrically conductive material, located in said space and having a seating end having a biasing means in said seating end, said plunger having means biasing said plunger to an outwardly extended position terminating coincidentally and surrounding said probe tip when said probe tip is in an outwardly extended position for fitting snugly against a target and shielding said probe tip against emission of RF energy and electrically connected to said shield.

3. A shielded electrical contact spring probe assembly as claimed in claim 2 wherein said probe is unitary structure including a receptacle, a plunger and a plunger tip, said plunger having means biasing said plunger and plunger tip to an outwardly extended position, said tip end having means for electrical contact with a target, said unitary structure having means for easy removal and replacement of said structure from said core bore.

4. A shielded electrical contact spring probe assembly comprising:
   a) a barrel formed of conductive material and having an open end and a remote end, said remote end providing means for an electrical path through said barrel;
   b) a core of dielectric material coaxially mounted within said barrel and having an open end coincident with said barrel open end, said core having an axial bore therein;
   c) an electrical contact spring probe reciprocally seated within said core bore and having a substantially cylindrical barrel with a spring seating end and an open end, four spaced crimps spaced about the circumference of said barrel at a location between said spring seating end an said open end, a compression spring seated in said spring seating end of said barrel, said compression spring providing means biasing said probe to an outwardly extended position, a plunger seated within said barrel and retained within said barrel by said crimps, said plunger further having a tail section, a shank section, and a tip section, said tip section axially extensible beyond said core open end, means for alternatively admitting and expelling air from said cylinder as said plunger reciprocates in said barrel, said tip end having means for making electrical contact with a target;
   d) a shield formed of electrically conductive material surrounding said core and extending full length thereof, and coincidentally terminating with said core at said open end, and said shield having means for an electrical conductive path through said shield and said barrel;
   e) said shield and said barrel being separated to form a space;

f) a shielding plunger, formed of electrically conductive material, located in said space and having a seating end having a biasing means in said seating end, said plunger having means biasing said plunger to an outwardly extended position terminating coincidentally and surrounding said probe tip when said probe tip is in an outwardly extended position for fitting snugly against a target and shielding said probe tip against emission of RF energy and electrically connected to said shield.

5. A shielded electrical contact spring probe assembly comprising:
   a) a barrel formed of conductive material and having an open end and a remote end, said remote end providing means for an electrical path through said barrel;
   b) a core of dielectric material coaxially mounted within said barrel and having an open end coincident with said barrel open end, said core having an axial bore therein;
   c) an electrical contact spring probe having a substantially cylindrical barrel with a spring end and an open end and four equally spaced V-shaped crimps about the circumference of said barrel at a location between said spring seating end and said open end, a compression spring seated in said spring seating end of said barrel, a plunger seated within said barrel and retained within said barrel by said crimps, said plunger further including a tail section having a cross-section larger than the cross section of said probe at said crimps, said tail section having a contact stem, said compression spring being pressed onto said contact stem, said compression spring providing means biasing said probe to an outwardly extended position, said tail section being disposed between said spring seating end of said barrel and said crimps, a probe tip section with a probe tip, said tip section axially extensible beyond said core open end, said probe tip end making electrical contact with a target;
   d) a shield formed of electrically conductive material surrounding said core and extending the full length thereof, and coincidentally terminating with said core at said open end, and said shield having means for an electrical conductive path through said shield and said barrel;
   e) said shield and said barrel being separated to form a space;
   f) a shielding plunger, formed of electrically conductive material, located in said space and having a seating end having a biasing means in said seating end, said plunger having means biasing said plunger to a outwardly extended position terminating coincidentally and surrounding said probe tip when said probe tip is in an outwardly extended position for fitting snugly against target and shielding said probe tip against emission of RF energy.

6. A shielded electrical contact spring probe assembly as claimed in claim 5 wherein said electrical contact spring probe plunger is made from a single piece of metal.

7. A shielded electrical contact spring probe assembly comprising:
   a) a barrel formed of conductive material and having an open end and a remote end, a crimp about the circumference of said barrel located between said open end and said remote end, said remote end providing means for an electrical path through said barrel;
   b) a core of dielectric material coaxially mounted within said barrel and having an open end coincident with said barrel open end, said core having an axial bore therein;
   c) an electrical contact spring probe reciprocally seated within said core bore and having a tip end axially extensible beyond said core open end, and a spring compression seating end having a compression spring seated in said seating end of said probe, said probe having means biasing said probe to an outwardly extended position, said probe having means for alternatively admitting and expelling air from said probe as said probe extends outwardly from said core bore, said probe tip end having means for electrical contact with a target, said probe having means for easy removal and replacement of said probe form said core bore;
   d) a shield formed of electrically conductive material surrounding said core and extending the full length thereof, and coincidentally terminating with said core at said open end, and said shield having means for an electrical conductive path through said shield and said barrel;
   e) said shield and said barrel being concentrically separated to form a space;
   f) a shielding plunger located in said space, having a substantially cylindrical barrel having a spring seating end, an open end, a crimp about the circumference of said barrel at a location between said open end and said spring seating end, a compression spring seated in said spring seating end, said spring seating end having a tail section having a cross section larger than the cross section of said barrel at said crimp, said tail section having a contact stem, said compression spring being pressed onto said contact stem, said tail section being disposed between said spring seating end and said crimp, said crimp of said barrel of said electrical contact spring probe assembly retaining said shielding plunger in said space, said shielding plunger having means for alternatively admitting and expelling air from said space as plunger extends outwardly from said barrel of said probe assembly, said compression spring providing means biasing said plunger to an outwardly extended position terminating coincidentally and surrounding said electrical contact spring probe tip when said probe tip is in an outwardly extended position for fitting snugly against a target and shielding said probe tip against emission of RF energy.

8. A shielded electrical contact spring probe assembly as claimed in claim 7 wherein said barrel of said shielding plunger is made from a single piece of metal.

9. A shielded electrical contact spring probe assembly comprising:
   a) a barrel formed of conductive material and having an open end and a remote end, a crimp about the circumference of said barrel located between said open end and said remote end, said remote end providing means for an electrical path through said barrel;
   b) a core of dielectric material coaxially mounted within said barrel and having an open end coincident with said barrel open end and a sealed end, said core having an axial bore therein, said sealed end terminating coincidentally with remote end, said core extending beyond barrel providing means for connecting an electrical transmission line to said remote end;

c) an electrical contact spring probe reciprocally seated within said core bore and having a tip end axially extensible beyond said core open end, said probe having means biasing said probe to an outwardly extended position, said probe tip end having means for electrical contact with a target, said probe having means for easy removal and replacement of said probe from said core bore;

d) a shield formed of electrically conductive material surrounding said core and extending the full length thereof, and coincidentally terminating with said core at said open end, said shield having means for an electrical conductive path through said shield and said barrel, said shield and said core providing means for said probe to have a selected impedance;

f) said shield and said barrel being separated to form a space;

g) a shielding plunger, formed of electrically conductive material, located in said space and having a seating end having a compression spring seated in said seating end, said plunger having means for alternatively admitting and expelling air from said annular channel as plunger extends outwardly from said barrel, said crimp of said barrel of said electrical contact spring probe assembly retaining said shielding plunger in said space, said compression spring providing means biasing said plunger to a outwardly extended position terminating coincidentally and surrounding said probe tip when said probe tip is in an outwardly extended position for fitting snugly against a target and shielding said probe tip against emission of RF energy.

10. A shielded electrical contact spring probe assembly comprising:

a) a barrel formed of conductive material and having two open ends;

b) a core of dielectric material coaxially mounted within said barrel and having open ends coincident with said barrel open ends, said core having an axial bore therein;

c) two electrical contact spring probes reciprocally seated and diametrically positioned within said core bore, each said probe having a tip end axially extensible beyond said core open ends and barrel open ends, each said probe having means biasing said probes to an outwardly extended position, each said probe tips being diametrically positioned providing means for simultaneous electrical contacts with two targets, said targets being parallel to each other, each said probe having means for easy removal and replacement of said probes from said core bore, d) a shield formed of electrically conductive material surrounding said core and extending the full length thereof, and coincidentally terminating with said core at said open ends, and said shield having means for an electrical conductive path through said shield and said barrel;

e) said shield and said barrel being separated to form a space;

f) two shielding plungers, formed of electrically conductive material, located in said space and each said plunger having a seating end having a means biasing seated in said seating end, each said plunger having means biasing said plungers to an outwardly extended position terminating coincidentally and surrounding said probe tips when said probe tips are in an outwardly extended position for fitting snugly against a target and shielding said probe tips against emission of R energy.

11. A shielded electrical contact spring probe assembly as claimed in claim 10 wherein each said probe is a unitary structure including a receptacle, a plunger and a plunger tip, each said plunger having means biasing said plunger and plunger tip to an outwardly extended position, each said tip end having means for electrical contact with a target, each said unitary structure having means for easy removal and replacement of said structure from said core bore.

12. A shielded electrical contact spring probe assembly comprising:

a) a barrel formed of conductive material and having two open ends;

b) a core of dielectric material coaxially mounted within said barrel and having open ends coincident with said barrel open ends, said core having an axial bore therein;

c) two electrical contact spring probes reciprocally seated and diametrically positioned within said core bore and each probe including a substantially cylindrical barrel with a spring seating end and an open end, four spaced crimps equally spaced about the circumference of each said barrel at a location between said spring seating end and said open end, a compression spring seated in said spring seating end of each said barrel, said compression spring providing means biasing each said probe to an outwardly extended position, a plunger seated within each said barrel and retained within each said barrel by said crimps, said plungers having a tail section, a shank section, and a tip section, each said tip section axially extensible beyond each said core open end, means for alternatively admitting and expelling air from each said cylinder as each said plunger reciprocates in each said barrel, said probe tips being diametrically positioned providing mean for simultaneous electrical contacts with two targets, said targets being parallel to each other;

d) a shield formed of electrically conductive material surrounding said core and extending the full length thereof, and coincidentally terminating with said core at said open ends, and said shield having means for an electrical conductive path through said shield and said barrel;

e) said shield and said barrel being separated to form a space;

f) two shielding plungers, formed of electrically conductive material, located in said space and each said plunger having a seating end having a means biasing seated in said seating end, each said plunger having means biasing said plungers to an outwardly extended position terminating coincidentally and surrounding said probe tips when said probe tips are in an outwardly extended position for fitting snugly against a target and shielding said probe tips against emission of RF energy.

13. A shielded electrical contact spring probe assembly comprising:

a) a barrel formed of conductive material and having two open ends;

b) a core of dielectric material coaxially mounted within said barrel and having open ends coincident with said barrel open ends, said core having an axial bore therein;

c) two electrical contact spring probes, each said probe including a substantially cylindrical barrel with a spring end and an open end and four equally spaced V-shaped crimps about the circumference of said barrel at a location between said spring seating end and said open end, a compression spring seated in said spring seating end of said barrel, a plunger seated within said barrel and retained within said barrel by said crimps, said plungers having a tail section having a cross-section larger than the cross section of said probes at said crimps, said tail section having a contact stem, said compression spring being pressed onto said contact stem, said compression spring providing means biasing each said probe to an outwardly extended position, said tail section being disposed between said spring seating end of said barrel and said crimps, a probe tip section with a probe tip, said tip section axially extensible beyond said core open end, said probe tips being diametrically positioned providing means for simultaneous electrical contacts with two targets said targets being parallel to each other;

d) a shield formed of electrically conductive material surrounding said core and extending the full length thereof, and coincidentally terminating with said core at said open ends, and said shield having means for an electrical conductive path through said shield and said barrel;

e) said shield and said barrel being separated to form a space;

f) two shielding plungers, formed of electrically conductive material, located in said space and each said plunger having a seating end having a means biasing seated in said seating end, each said plunger having means biasing said plungers to an outwardly extended position terminating coincidentally and surrounding said probe tips when said probe tips are in an outwardly extended position for fitting snugly against target and shielding said probe tips against emission of R energy.

14. A shielded electrical contact spring probe assembly as claimed in claim 14 wherein each said electrical contact spring probe plunger is made from a single piece of metal.

15. A shielded electrical contact spring probe assembly comprising:

a) a barrel formed of conductive material and having two open ends, two crimps about the circumference of said barrel located between said open end and said remote end;

b) a core of dielectric material coaxially mounted within said barrel and having open ends coincident with said barrel open ends, said core having an axial bore therein;

c) two electrical contact spring probes reciprocally seated and diametrically positioned within said core bore, each said probe having a tip end axially extensible beyond said core open ends and barrel open ends, each said probe having means biasing said probes to an outwardly extended position, each said probe tips being diametrically positioned providing means for simultaneous electrical contacts with two targets, said targets being parallel to each other, each said probe having means for easy removal and replacement of said probes from said core bore;

d) a shield formed of electrically conductive material surrounding said core and extending the full length thereof, and coincidentally terminating with said core at said open ends, and said shield having means for an electrical conductive path through said shield and said barrel;

e) said shield and said barrel being separated to form a space;

f) two shielding plungers located in said space, each comprising a substantially cylindrical barrel having a spring seating end, an open end, a crimp about the circumference of said barrel at a location between said open end and said spring seating end, a compression spring seated in said spring seating end, said spring seating end having a tail section having a cross section larger than the cross section of said barrel at said crimp, said tail section having a contact stem, said compression spring being pressed onto said contact stem, said tail section being disposed between said spring seating end and said crimp, each said crimp of said barrel of said electrical contact spring probe assembly retain said shielding plungers in said space, each said plunger having means for alternatively admitting and expelling air from said space as each plunger extends outwardly from said barrel of said probe assembly, each said compression spring providing means biasing each said plunger to an outwardly extended position terminating coincidentally and surrounding said probe tips when each said probe tip is in an outwardly extended position for fitting snugly against a target and shielding each said probe tip against emission of RF energy.

16. A shielded electrical contact spring probe assembly as claimed in claim 15 wherein each said shielding plunge is made from a single piece of metal.

17. A shielded electrical contact spring probe assembly comprising:

a) a barrel formed of conductive material and having two open ends, two crimps about the circumference of said barrel located between said open end and said remote end;

b) a core of dielectric material coaxially mounted within said barrel and having open ends coincident with said barrel open ends, said core having an axial bore therein;

c) two electrical contact spring probes reciprocally seated and diametrically positioned within said core bore, each said probe having a tip end axially extensible beyond said core open ends and barrel open ends, each said probe having means biasing said probes to an outwardly extended position, each said probe tips being diametrically positioned providing means for simultaneous electrical contacts with two targets, said targets being parallel to each other, each said probe having means for easy removal and replacement of said probes from said core bore;

d) a shield formed of electrically conductive material surrounding said core and extending the full length thereof, and coincidentally terminating with said core at said open ends, and said shield having means for an electrical conductive path through said shield and said barrel, said shield and said core providing means for each said probe to have a selected impedance;

e) said shield and said barrel being separated to form a space;

f) two shielding plungers, formed of electrically conductive material, located in said space and each said plunger having a seating end having a means biasing seated in said seating end, each said crimp of said barrel of said electrical contact spring probe assembly retain said shielding plungers in said space, each said plunger having means biasing said plungers to an outwardly extended position terminating coincidentally and surrounding said probe tips when said probe tips are in an outwardly extended position for fitting snugly against a target and shielding said probe tips against emission of RF energy.

18. The coaxial electric connector probe assembly of claim 1 wherein the dielectric insulating material is mad preferably of foamed "Teflon".

19. The coaxial electric connector probe assembly of claim 1 wherein the outer conductive circular barrel is made of beryllium copper.

20. The coaxial electric connector probe assembly of claim 1 wherein the grounding shield concentric plunger made of beryllium copper.

21. The coaxial electric connector probe assembly of claim 1 wherein the barrel enclosed grounding shield is made of a very thin layer of non-magnetic stainless steel.

22. The coaxial electric connector probe assembly of claim 1 wherein all parts are gold-plated.

* * * * *